United States Patent
Kobayashi

(12) 
(10) Patent No.: US 6,252,463 B1
(45) Date of Patent: Jun. 26, 2001

(54) HIGH-FREQUENCY SWITCH, ADJUSTABLE HIGH-FREQUENCY SWITCH, AND ADJUSTABLE HIGH-FREQUENCY POWER AMPLIFIER

(75) Inventor: Kazuhiko Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/442,759

(22) Filed: Nov. 18, 1999

(30) Foreign Application Priority Data

Mar. 19, 1999 (JP) .................................................. 11-076317

(51) Int. Cl.$^7$ ....................................................... H03F 3/04
(52) U.S. Cl. ............................. 330/311; 330/295; 330/51
(58) Field of Search .............................. 330/51, 295, 311, 330/403 F

(56) References Cited

U.S. PATENT DOCUMENTS

| | | | |
|---|---|---|---|
| 4,757,276 | * | 7/1988 | Ishii et al. ............................. 330/278 |
| 5,218,318 | * | 6/1993 | Ikuzawa ................................ 330/254 |
| 5,742,205 | * | 4/1998 | Cowen et al. ........................ 330/269 |
| 6,046,640 | * | 4/2000 | Brunner ................................ 330/254 |
| 6,121,842 | * | 9/2000 | Adlerstein ............................. 330/307 |

* cited by examiner

Primary Examiner—Robert Pascal
Assistant Examiner—Henry Choe
(74) Attorney, Agent, or Firm—Arent Fox Kintner Plotkin Kahn, PLLC

(57) ABSTRACT

A high-frequency switch is configured of first and second bipolar transistors connected into a cascode configuration. Current to be supplied from the collector of the second bipolar transistor at the subsequent stage is controlled by the "on" and "off" of a control signal which is received by the base of the transistor. Accordingly, the high-frequency switch operates as one which has a gain in its on-control mode and which has high isolation characteristics in its off-control mode. In addition, an adjustable high-frequency switch is configured by placing a plurality of high-frequency switches as described above in parallel. Herein, the bases of the first bipolar transistors are interconnected and receive a common input signal. The bases of the second bipolar transistors can select the destination the input signal is to be outputted by respectively receiving different control signals. By having the bases of the second bipolar transistors receive a common control signal, the adjustable high-frequency switch operates as a power divider in its on-control mode and as an attenuator in its off-control mode. Further, an adjustable high-frequency power amplifier is configured in such a way that the outputs of the adjustable high-frequency switch described above are respectively connected to the bases of third bipolar transistors whose emitters are grounded. The adjustable high-frequency power amplifier can lower power consumption by turning the respective control signals "on" and "off" in accordance with the required output power.

4 Claims, 13 Drawing Sheets

Block diagram showing the fundamentals of the first embodiment of an adjustable high-frequency switch

Prior Art

Circuit diagram showing a high-frequency amplifier

Block diagram showing the fundamentals of the first and second embodiments of a high-frequency switch Block diagram showing the fundamentals of the first embodiment of an adjustable high-frequency switch Block diagram showing the fundamentals of the second embodiment of the adjustable high-frequency switch Block diagram showing the fundamentals of the first and second embodiments of an adjustable high-frequency power amplifier Circuit diagram showing the first embodiment of the high-frequency switch Circuit diagram showing the second embodiment of the high-frequency switch Circuit diagram showing the second embodiment of the adjustable high-frequency switch Circuit diagram showing the second embodiment of the adjustable high-frequency amplifier

HIGH-FREQUENCY SWITCH, ADJUSTABLE HIGH-FREQUENCY SWITCH, AND ADJUSTABLE HIGH-FREQUENCY POWER AMPLIFIER

BACKGROUND OF THE INVENTION

1. Field of the Invention

The present invention relates to a high-frequency switch for intermitting a high-frequency signal, and more particularly to a high-frequency switch having high isolation characteristics.

Also, the present invention relates to an adjustable high-frequency power amplifier which is capable of adjusting its output power.

Further, the present invention relates to a monolithic microwave integrated circuit (MMIC) in which the high-frequency switch or the adjustable high-frequency power amplifier described above is formed.

2. Description of the Related Art

In recent years, mobile communications such as cellular phone has been shifting from analog mobile communication systems to digital mobile communication systems by virtue of the rapid progress of LSI technology.

One of the digital mobile communication systems is the PDC (Personal Digital Cellular) system. The PDC system adopts the TDMA (Time Division Multiple Access) system, and the portable terminal can perform the packet communication of, at most, 28.8 kbps. The portable terminal of the PDC system performs the control of varying its output power within a range of about 30 dB in accordance with the distance thereof from a base station.

FIG. 1 shows an example of a circuit which is used in a power amplifier for transmission in the portable terminal of the PDC system. The power amplifier 1 includes a bipolar transistor 2 which has an emitter grounded. The transistor 2 has a finger number corresponding to the maximum output power of the portable terminal. The base of the transistor 2 receives an input signal IN of high frequency through an input matching circuit 3. The collector of the transistor 2 outputs an output signal OUT generated by amplifying the input signal IN, through an output matching circuit 4. The base of the transistor 2 is supplied with a base bias through an inductor 5 which features sufficiently high impedance at the frequency to be used. The collector of the transistor 2 is supplied with a supply voltage VCC through an inductor 6 which features a sufficiently high impedance at the frequency to be used.

The power amplifier 1 described above receives from another circuit of the portable terminal the input signal IN (voice or data) of the power in accordance with the distance thereof from the base station. The transistor 2 amplifies the input signal IN, and sends the amplified signal as the output signal OUT toward the base station.

Meanwhile, it is known that, in general, the portable terminal of the PDC system or the like often uses an output power level which is about 10 dB lower than the maximum output power. The circuit shown in FIG. 1 is used the bipolar transistor 2 of the finger number corresponding to the maximum output power. Therefore, as the output power is lower, a wasteful steady current not contributing to the amplification flows more through the transistor 2. As in the case when the output power level is often used described above, a considerable amount of steady current has flowed through the transistor 2.

On the other hand, the W-CDMA (Wideband Code Division Multiple Access) system has been proposed as a new digital mobile communication system. A portable terminal of the W-CDMA system diffuses a transmission signal by using the diffusion code, and outputs diffused data to the base station. Besides, the W-CDMA system is specified so as to change its output power, depending upon voice and data, and the portable terminal of this system must control the output power in a wide range more than 70 dB.

In a case where the power amplifier 1 shown in FIG. 1 is applied as a power amplifier for transmission in the portable terminal of the W-CDMA system, the finger number of the transistor 2 is determined in adaptation to the maximum output power similarly to that in the PDC system. However, in the W-CDMA system, the control range of the output power is predetermined more than 70 dB. Therefore, as the output power is lower, a wasteful steady current not contributing to the amplification flows more through the transistor 2. This steady current is greater than the steady current in the power amplifier of the portable terminal of the PDC system described above. The power amplifier is one of circuits which consume electric power most in the portable terminal. Accordingly, in the case where the power amplifier 1 shown in FIG. 1 is applied to the portable terminal of the W-CDMA system, there have been the problems that the power consumption of the portable terminal increases, that the quantity of heat generation thereof enlarges, and that the talking time is obliged to shorten.

In order to reduce the power consumption of the portable terminal of the W-CDMA system, the inventor has considered that two power amplifiers are combined so as to operate either or both of them, thereby to vary the output power of the portable terminal. In case of configuring such an adjustable power amplifier, however, the portable terminal needs to be provided further with a change-over circuit and matching circuits for high-frequency signals. As a result, there have been the problems that there needs to be a number of components and the portable terminal cannot be made in small size.

As a technique for making the size of the portable terminal small, it is considered that the power amplifier or the like are implemented on an MMIC (Monolithic Microwave Integrated Circuit), thereby making the total number of components smaller. However, there has not been proposed such a circuit technology using bipolar transistors wherein a high-frequency switch, which has high isolation characteristics in an off-control mode and has little influence on the input side corresponding to the change of a load in an on-control mode, is formed on the MMIC. Therefore, it has been impossible to form the adjustable power amplifier on a single chip as the MMIC.

SUMMARY OF THE INVENTION

An object of the present invention is to provide a high-frequency switch and an adjustable high-frequency switch each of which has high isolation characteristics.

Another object of the present invention is to provide a high-frequency switch and an adjustable high-frequency switch in each of which the change of the load in an on-control mode has little influence on an input side.

Still another object of the present invention is to provide an adjustable power amplifier which can lower power consumption even in a case where there is a wide control range of output power.

Yet another object of the present invention is to form each of the high-frequency switch described above, adjustable high-frequency switch and adjustable power amplifier on an MMIC and to thus make the size thereof small.

A high-frequency switch according to the present invention is configured by connecting the first and second bipolar transistors into a cascode configuration. The base of the first bipolar transistor at the prior stage receives an input signal having high frequency. On the other hand, the base of the second bipolar transistor at the subsequent stage receives a control signal which on/off-controls the second bipolar transistor. The collector of the second bipolar transistor outputs an output signal generated by amplifying the input signal. Owing to the above configuration, the current which is supplied from the collector of the second bipolar transistor becomes controllable by the control signal, and the first and second bipolar transistors operate as the switch.

The high-frequency switch operates as a cascode amplifier and has a gain in an on-control mode based on the control signal. Since "S12 characteristics" (S parameter) featuring the cascode amplifier feature high isolation characteristics, the change of a load connected to the collector of the second bipolar transistor has no influence on the input signal. The operating region of the second bipolar transistor becomes a cut-off region by the off-control of the control signal. Therefore, a high-frequency switch which has high isolation characteristics is configured.

Further, the first bipolar transistor has an impedance higher than the output impedance of an input side circuit which outputs the input signal. The changes made by the on/off-control of the control signal to the impedance are little. Therefore, the high-frequency switch to which the output impedance of the input side circuit is uninfluenceable is configured.

An adjustable high-frequency switch according to the present invention is such that a plurality of high-frequency switches as explained above are connected in parallel. The bases of the first bipolar transistors in the respective high-frequency switches are interconnected. These bases receive a common input signal. The bases of the second bipolar transistors in the respective high-frequency switches are fed the corresponding control signals which are different from each other (one another).

Each high-frequency switch is on/off-controlled by each control signal. The input signal is amplified by respective high-frequency switch(es) which are on-controlled and outputted as output signal(s). In other words, the destination(s) of the input signal is outputted to is/are selected by the on/off-controls of the control signals. Since the high-frequency switches are respectively on/off-controlled by the control signals, the destination(s) the input signal is outputted to can be selected without disposing any special change-over circuit on an input side. That is, an adjustable high-frequency switch is configured.

Another adjustable high-frequency switch according to the present invention is such that a plurality of high-frequency switches as explained above are connected in parallel. The bases of the first bipolar transistors in the respective plurality of high-frequency switches are interconnected. These bases receive a common input signal. The bases of the second bipolar transistors in the respective high-frequency switches receive a common control signal.

The input signal is amplified in accordance with the amplification capability of the respective high-frequency switches when the common control signal is "on". The amplified signals are outputted as output signals. That is, this adjustable high-frequency switch operates as a power divider when the control signal is "on". Since the respective high-frequency switches have high isolation characteristics, this adjustable high-frequency switch operates as an attenuator when the control terminals (i.e., the bases of the second bipolar transistors) are off-controlling.

An adjustable high-frequency power amplifier according to the present invention is such that the collectors of the second bipolar transistors which are the outputs of the adjustable high-frequency switch are respectively connected to the bases of the third bipolar transistors of which the emitters are grounded. The collectors of the third bipolar transistors are respectively interconnected so as to be outputted as an output signal.

Therefore, the predetermined third bipolar transistor(s) is/are operated by turning "on" and "off" the respective control signals in accordance with required output power. As a result, the flow of steady current which is wasteful and does not contribute to the amplification is reduced, lowering the power consumption. The effect of lowering the power consumption is remarkable in a case where the output power is low.

Another adjustable high-frequency power amplifier according to the present invention is such that the bases of the third bipolar transistors in the adjustable high-frequency power amplifier explained above are supplied with operating-biases operating together with the on-controls of the control terminals. Therefore, the base currents of the third bipolar transistors which are not operating are decreased, and the power amplifier having low power consumption is configured.

DESCRIPTION OF THE PREFERRED EMBODIMENTS

Figure 1:
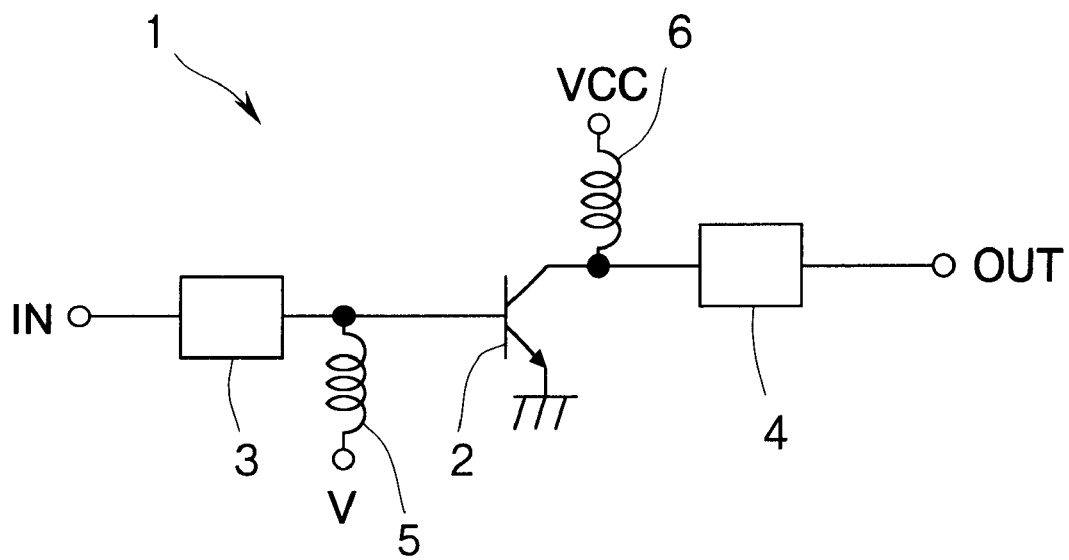
FIG. 1 is a circuit diagram showing a high-frequency amplifier in the prior art.
Figure 2:
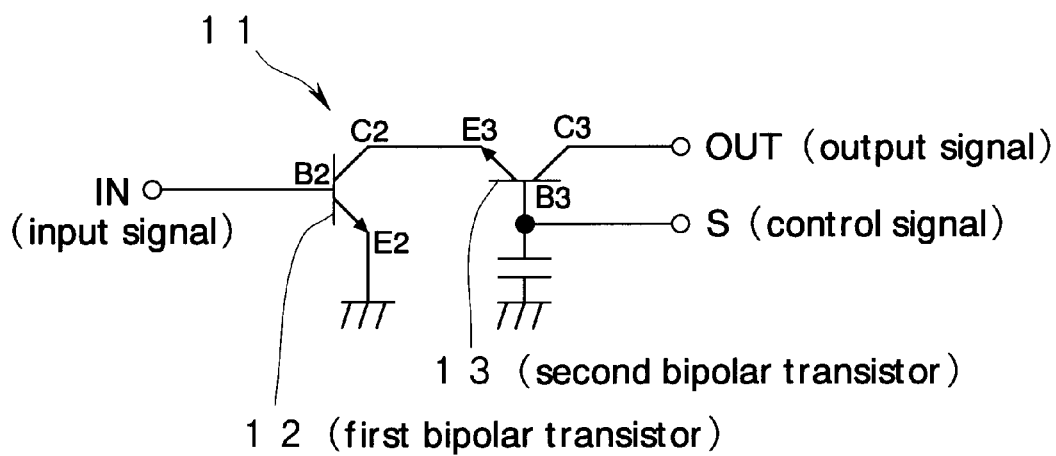
FIG. 2 is a block diagram showing the fundamentals of the first and second embodiments of a high-frequency switch according to the present invention.

FIG. 2 is a block diagram showing the fundamentals of the first and second embodiments of a high-frequency switch according to the present invention. It is so configured that the first and second bipolar transistors 12 and 13 are connected into a cascode configuration. The base B2 of the first transistor 12 at the prior stage receives an input signal IN having high frequency. On the other hand, the base B3 of the second transistor 13 at the subsequent stage receives a control signal S which on/off-controls the second transistor 13. The collector C3 of the second transistor 13 outputs an output signal OUT generated by amplifying the input signal IN.

Figure 3:
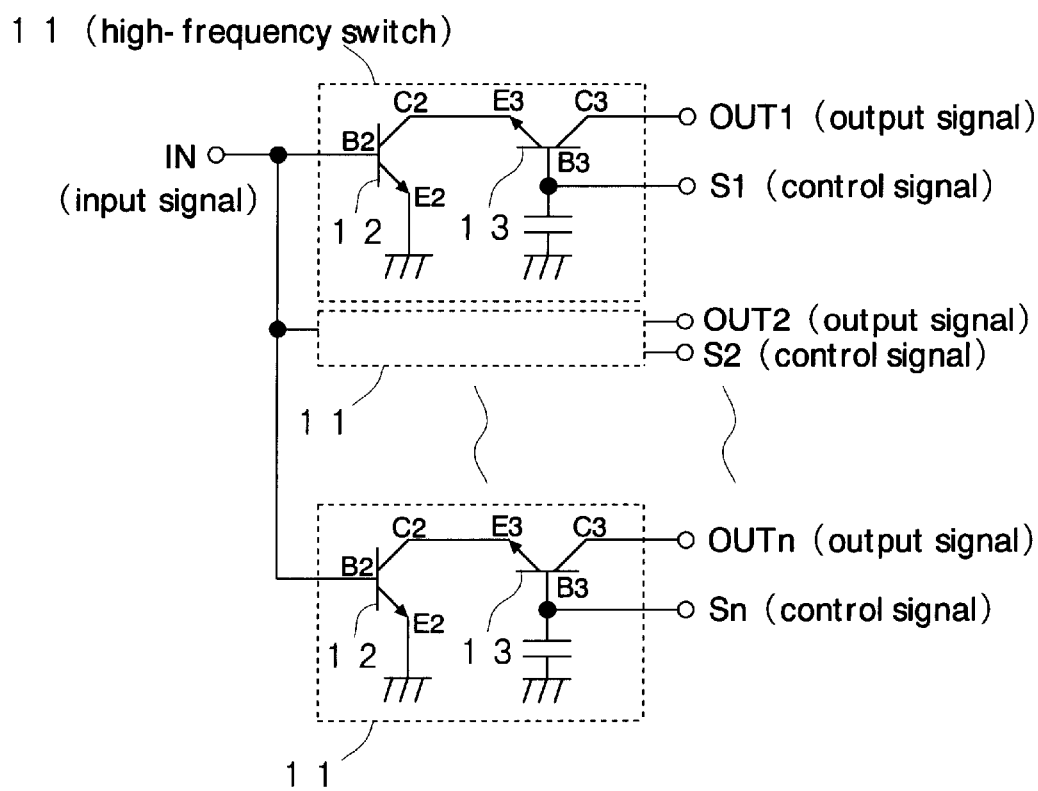
FIG. 3 is a block diagram showing the fundamentals of the first embodiment of an adjustable high-frequency switch according to the present invention.

FIG. 3 is a block diagram showing the fundamentals of the first embodiment of an adjustable high-frequency switch according to the present invention.

An adjustable high-frequency switch is such that a plurality of high-frequency switches 11 as shown in FIG. 2 are connected in parallel. The bases B2 of the first transistors 12 in the plurality of respective high-frequency switches 11 are interconnected. These bases B2 receive a common input signal IN. The bases B3 of the second transistors 13 in the respective high-frequency switches 11 are fed the corresponding control signals S1–Sn which are different from each other (one another).

Figure 4:
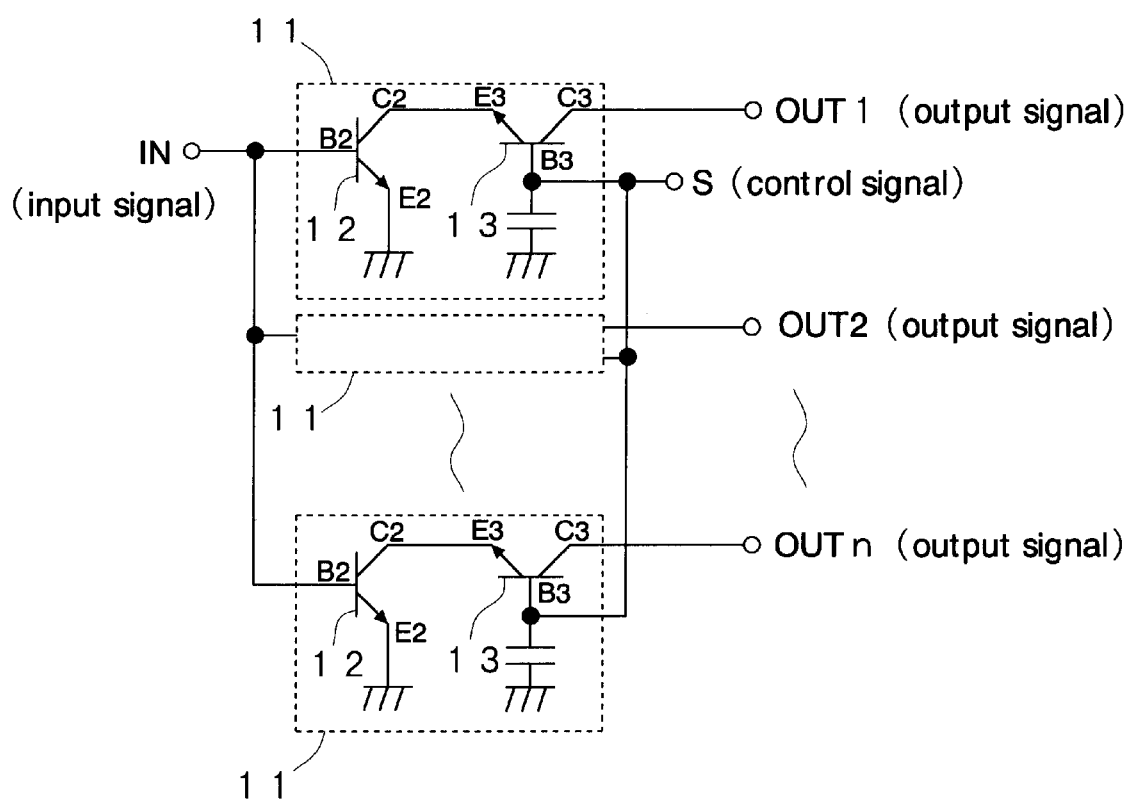
FIG. 4 is a block diagram showing the fundamentals of the second embodiment of the adjustable high-frequency switch according to the present invention.

FIG. 4 is a block diagram showing the fundamentals of the second embodiment of the adjustable high-frequency switch according to the present invention.

The adjustable high-frequency switch is such that a plurality of high-frequency switches 11 as shown in FIG. 2 are connected in parallel. The bases B2 of the first transistors 12 in the plurality of respective high-frequency switches 11 are interconnected. These bases B2 receive a common input signal IN. The bases B3 of the second transistors 13 in the respective high-frequency switches 11 receive a common control signal S.

Figure 5:
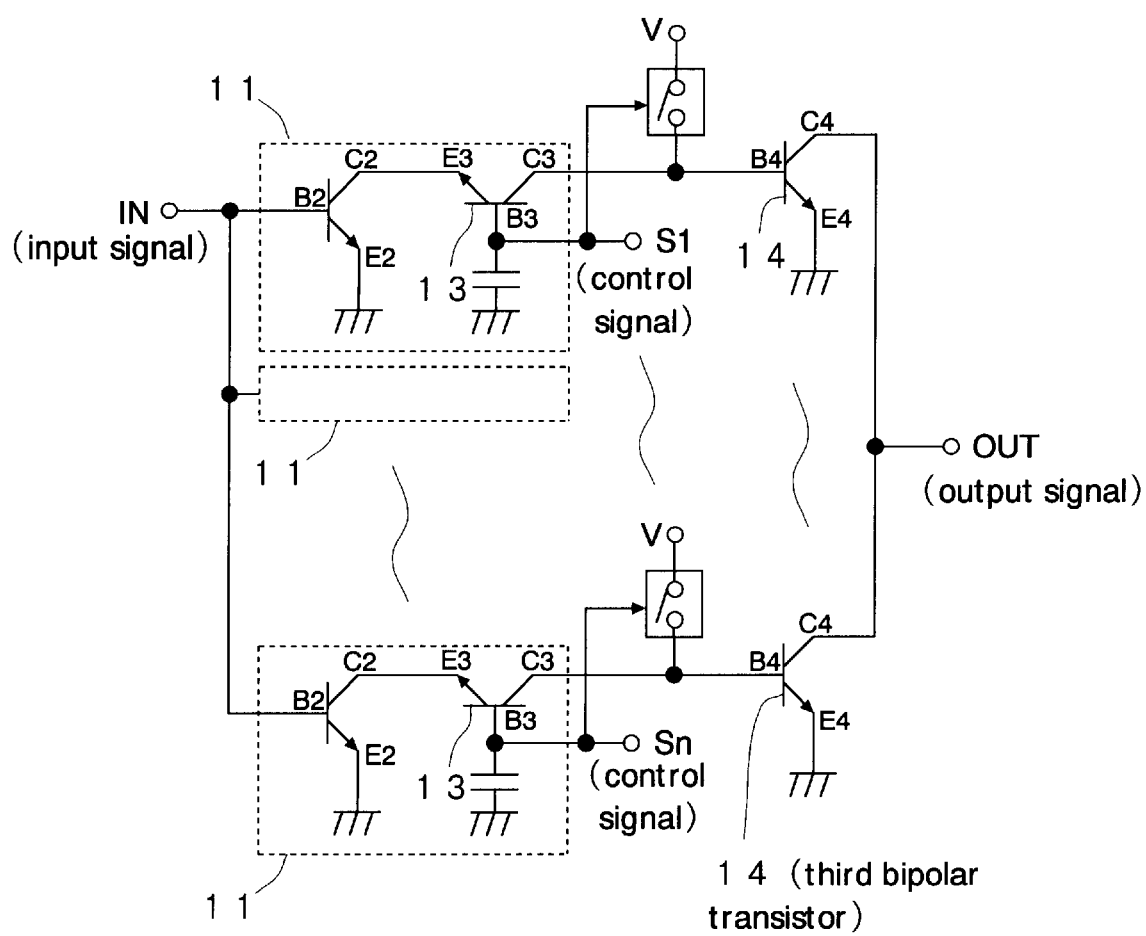
FIG. 5 is a block diagram showing the fundamentals of the first and second embodiments of an adjustable high-frequency power amplifier according to the present invention.

FIG. 5 is a block diagram showing the fundamentals of the first and second embodiments of an adjustable high-frequency power amplifier according to the present invention.

An adjustable high-frequency power amplifier is such that the collectors C3 of the second transistors 13 which are the outputs of the adjustable high-frequency switch shown in FIG. 3 are respectively connected to the bases B4 of the third bipolar transistors 14 of which the emitters are grounded. The collectors C4 of the respective third transistors 14 are respectively interconnected so as to be outputted as an output signal OUT. In addition, the bases B4 of the third transistors 14 are supplied an operating-bias V operating together with the on-controls of the corresponding control terminals S1–Sn.

Now, the embodiments will be described with reference to the drawings.

Figure 6:
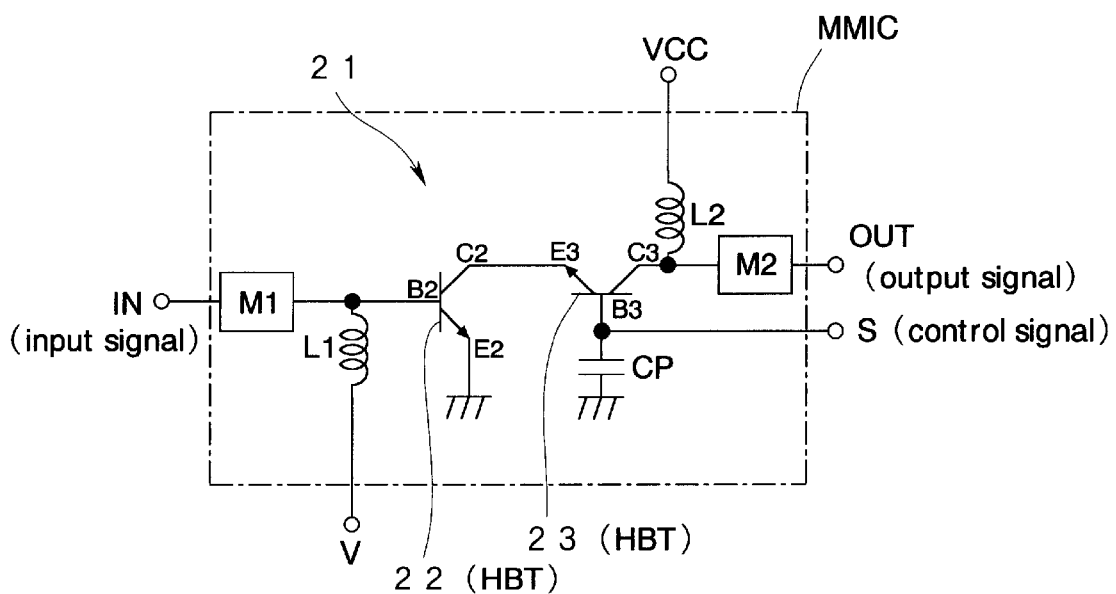
FIG. 6 is a circuit diagram showing the first embodiment of the high-frequency switch according to the present invention.

FIG. 6 shows the first embodiment of the high-frequency switch according to the present invention.

The high-frequency switch 21 according to this embodiment is formed including bipolar transistors, inductors, or the like on a GaAs substrate by the use of semiconductor manufacturing technology. That is, the high-frequency switch 21 is formed as an MMIC. Besides, HBTs (Heterojunction Bipolar Transistors) are used as the bipolar transistors.

The high-frequency switch 21 is configured in a way of cascode connecting the HBT 22 which has an emitter grounded and the HBT 23 which has a base grounded in a high-frequency field through a capacitor CP. The HBT 22 and HBT 23 correspond to the first bipolar transistor and second bipolar transistor as shown in FIG. 2, respectively. The base B2 of the HBT 22 at a prior stage receives an input signal IN of high frequency through an input matching circuit M1. This base B2 is supplied with a base bias V through an inductor L1 which features sufficiently high impedance at the frequency to be used. The base B3 of the HBT 23 at a subsequent stage receives a control signal S for on/off-controlling HBT 23. The operating region of the HBT 23 becomes an active region when the control signal S is at its high level, and becomes a cut-off region when the control signal S is at its low level. The collector C3 of the HBT 23 outputs an output signal OUT through an output matching circuit M2. The collector C3 is supplied with a supply voltage VCC through an inductor L2 which features sufficiently high impedance at the frequency to be used.

Here, the input matching circuit M1 and output matching circuit M2 are formed by combining capacitors and inductors which are not shown.

Each capacitor is formed by an MIM (Metal-Insulator-Metal) capacitor or the like in which an insulator is sandwiched in between conductive layers. Each inductor is formed by a spiral inductor or the like in which a conductor is placed in a spiral shape.

The high-frequency switch 21 described above receives the control signal S which is the direct-current voltage of the high level or low level at the base B3 of the HBT 23. When the control signal S is at a high level, the high-frequency switch 21 operates as acascode amplifier. More specifically, the input signal IN of microwave or the like fed to the base B2 of the HBT 22 is outputted as the output signal OUT after being amplifying. on this occasion, the change of a load (not shown) connected to the collector C3 of the HBT 23 does not have an influence on the input signal IN owing to the HBT 22 located at the prior stage.

On the other hand, the high-frequency switch 21 has high isolation characteristics for the reason that the operating region of the HBT 23 becomes the cut-off region when the control signal S is at a low level. In this embodiment, the isolation characteristics become more than 20 dB when the frequency of the input signal IN is at 2 GHz.

Accordingly, the high-frequency switch according to this embodiment is able to have a gain in its on-control mode and the high isolation characteristics in its off-control mode by controlling the current supplied from the collector C3 of the HBT 23 by the control signal S.

Moreover, all the elements configuring the high-frequency switch 21 can be formed on the GaAs substrate by the semiconductor manufacturing technology. That is, the high-frequency switch having the high isolation characteristics can be formed as the MMIC.

Figure 7:
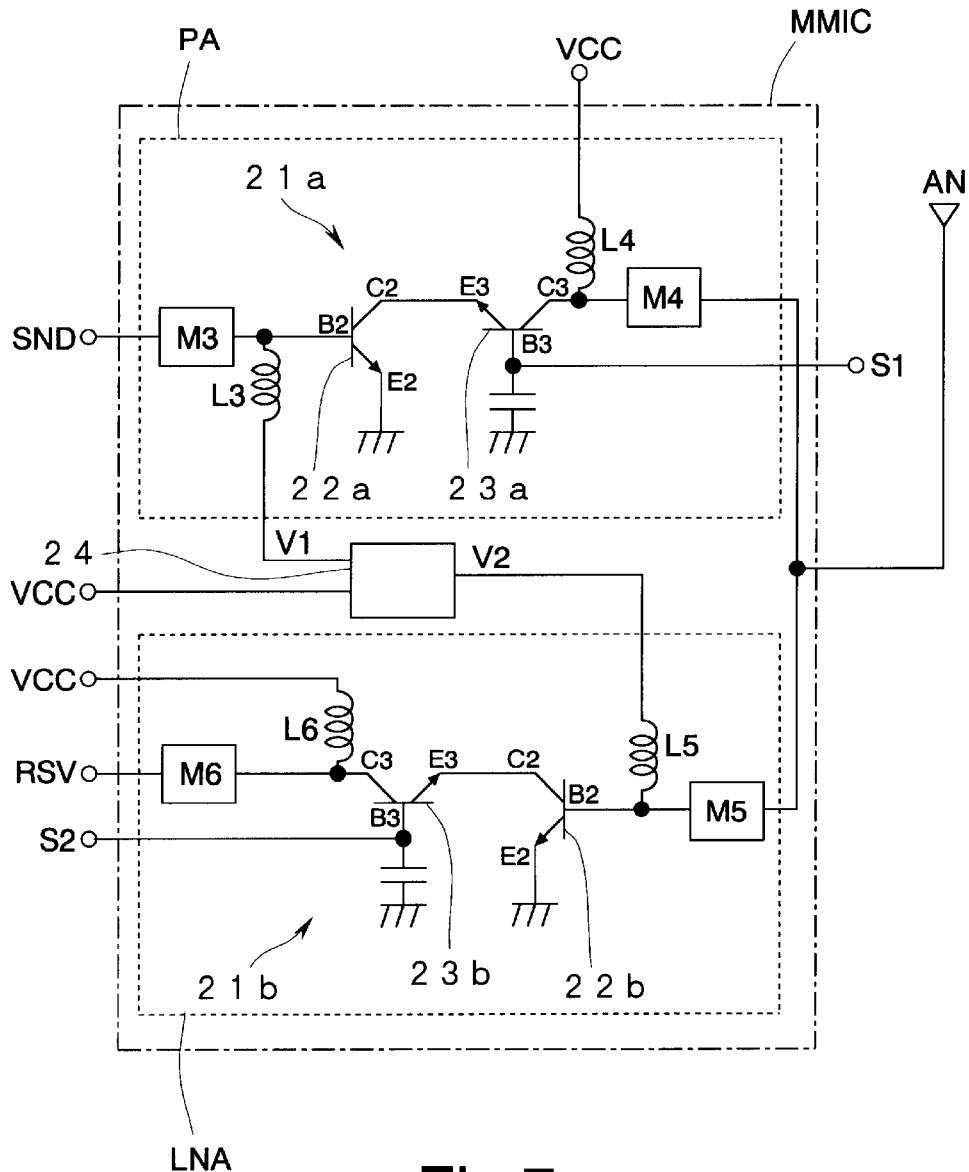
FIG. 7 is a circuit diagram showing the second embodiment of the high-frequency switch according to the present invention.

FIG. 7 shows the second embodiment of the high-frequency switches according to the present invention.

In this embodiment, high-frequency switches 21a and 21b according to the first embodiment described above are placed in parallel on an MMIC.

The base B2 of the HBT 22a of the high-frequency switch 21a receives a transmitting signal SND through an input matching circuit M3. The base B2 of the HBT 22a is supplied with a base bias VI through an inductor L3 which features sufficiently high impedance at the frequency to be used. The base bias V1 is generated from a supply voltage VCC by the use of a power-supply circuit 24 formed on the MMIC. The base B3 of the HBT 23a of the high-frequency switch 21a receives a control signal S1. The collector C3 of the HBT 23a is connected to an antenna AN through an output matching circuit M4. The collector C3 of the HBT 23a is supplied with the supply voltage VCC applied through an inductor L4 which features sufficiently high impedance at the frequency to be used.

The base B2 of the HBT 22b of the high-frequency switch 21b is connected to the antenna AN through an input matching circuit M5. The base B2 of the HBT 22b is supplied with a base bias V2 through an inductor L5 which features sufficiently high impedance at the frequency to be used. The base bias V2 is generated by using the power-supply circuit 24. The base B3 of the HBT 23b of the high-frequency switch 21b receives a control signal S2. The collector C3 of the HBT 23b outputs a receiving signal RSV through an output matching circuit M6. The collector C3 of the HBT 23b is supplied with the supply voltage VCC through an inductor L6 which features sufficiently high impedance at the frequency to be used.

And, a power amplifier PA is configured by the high-frequency switch 21a, while a low noise amplifier LNA is configured by the high-frequency switch 21b. That is, a change-over switch for transmitting and receiving is realized by a single chip. The switch is used as, for example, a transmitting/receiving change-over switch in a radio LAN (Radio Local Area Network) or the like.

The high-frequency switches described above receive the control signal S1 of high level and the control signal S2 of low level in a transmitting mode. Consequently, the high-frequency switch 21a is activated, and the high-frequency switch 21b is inactivated. The transmitting signal SND fed to the high-frequency switch 21a is amplified and then outputted from the antenna AN.

Besides, the high-frequency switches receive the control signal S1 of low level and the control signal S2 of high level in a receiving mode. Consequently, the high-frequency switch 21a is inactivated, and the high-frequency switch 21b is activated. Accordingly, a signal received from the antenna AN is amplified and then outputted as the receiving signal RSV by the high-frequency switch 21b.

The high-frequency switches according to this embodiment has effects similar to those of the first embodiment described above.

Figure 8:
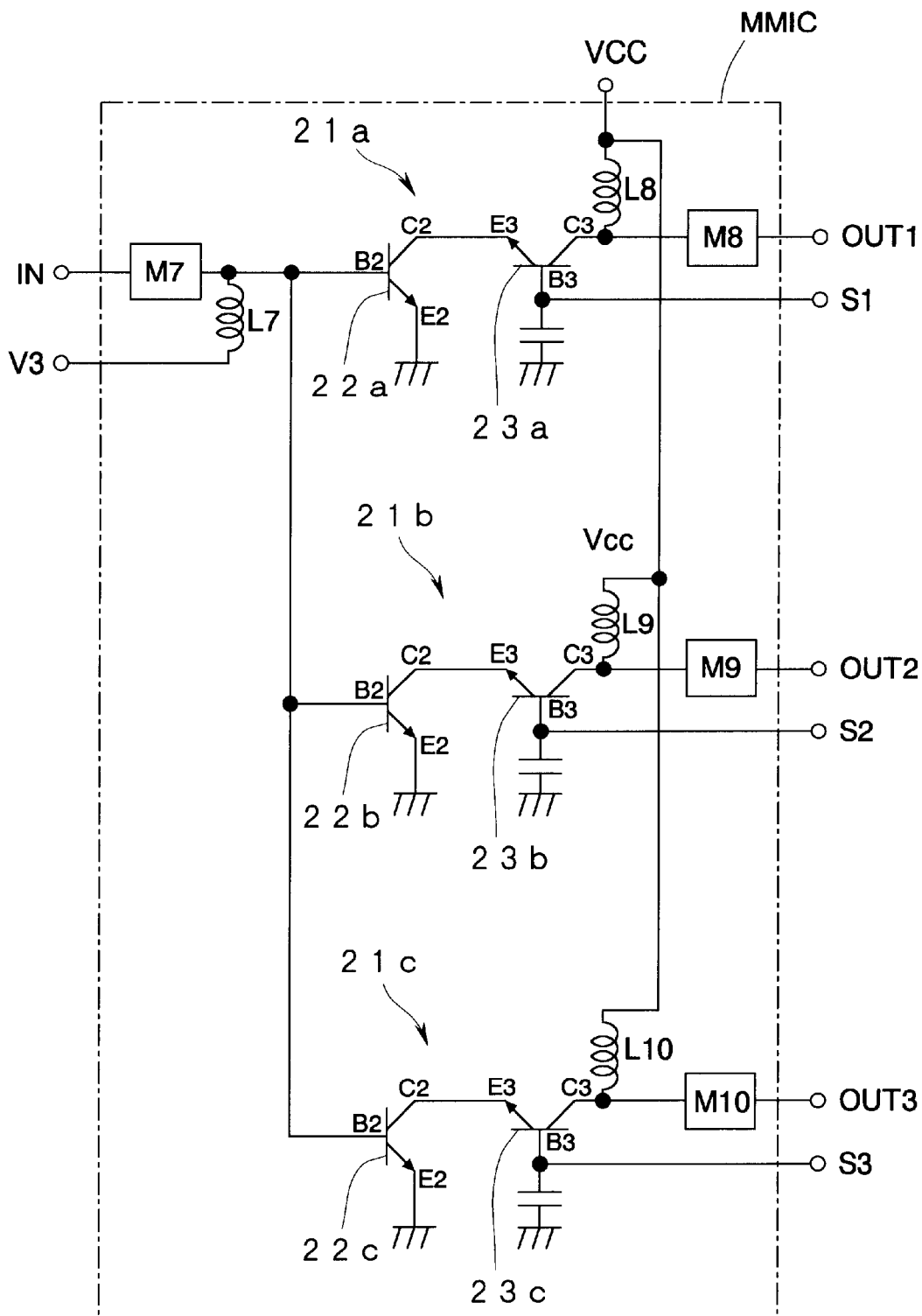
FIG. 8 is a circuit diagram showing the first embodiment of the adjustable high-frequency switch according to the present invention.

FIG. 8 shows the first embodiment of the adjustable high-frequency switches according to the present invention.

In this embodiment, high-frequency switches 21a, 21b, and 21c according to the first embodiment are placed in parallel on an MMIC. The bases B2 of the HBTs 22a, 22b, and 22c for each of high-frequency switches 21a, 21b, and 21c are connected with one another. These bases B2 receive a common input signal IN through an input matching circuit M7. In addition, these bases B2 is supplied with a base bias V3 through an inductor L7 which features sufficiently high impedance at the frequency to be used.

The bases B3 of the HBTs 23a, 23b, and 23c for each of high-frequency switches 21a, 21b, and 21c receive control signals S1, S2, and S3, respectively. The collectors C3 of the HBTs 23a, 23b, and 23c is supplied with a supply voltage VCC inductors L8, L9, and L10 which feature sufficiently high impedance at the frequency to be used.

The collector C3 of the HBT 23a outputs an output signal OUT1 through an output matching circuit M8. The collector C3 of the HBT 23b outputs an output signal OUT2 through an output matching circuit M9. The collector C3 of the HBT 23c outputs an output signal OUT3 through an output matching circuit M10.

The adjustable high-frequency switches described above activate or inactivate each of high-frequency switches 21a, 21b, and 21c by setting the control signals S1, S2, and S3 at a high level or a low level. And, the input signal IN which is amplified is outputted to the outside of the MMIC as the predetermined output signals OUT1, OUT2, and OUT3.

Furthermore, the isolation characteristics among the output (C3 of the HBTs 23a, 23b, and 23c) become more than 20 dB when the frequency of the input signal IN is at 2 GHz.

The adjustable high-frequency switches according to this embodiment have effects similar to those of the first embodiment of the high-frequency switch described above.

Furthermore, the adjustable high-frequency switches according to this embodiment make any special change-over circuit on the MMIC unnecessary for the reason that the destination the input signal IN is to be outputted to can be easily selected by the control signals S1, S2, and S3. Since any special change-over circuit is unnecessary, the chip size of the MMIC can be made small.

Figure 9:
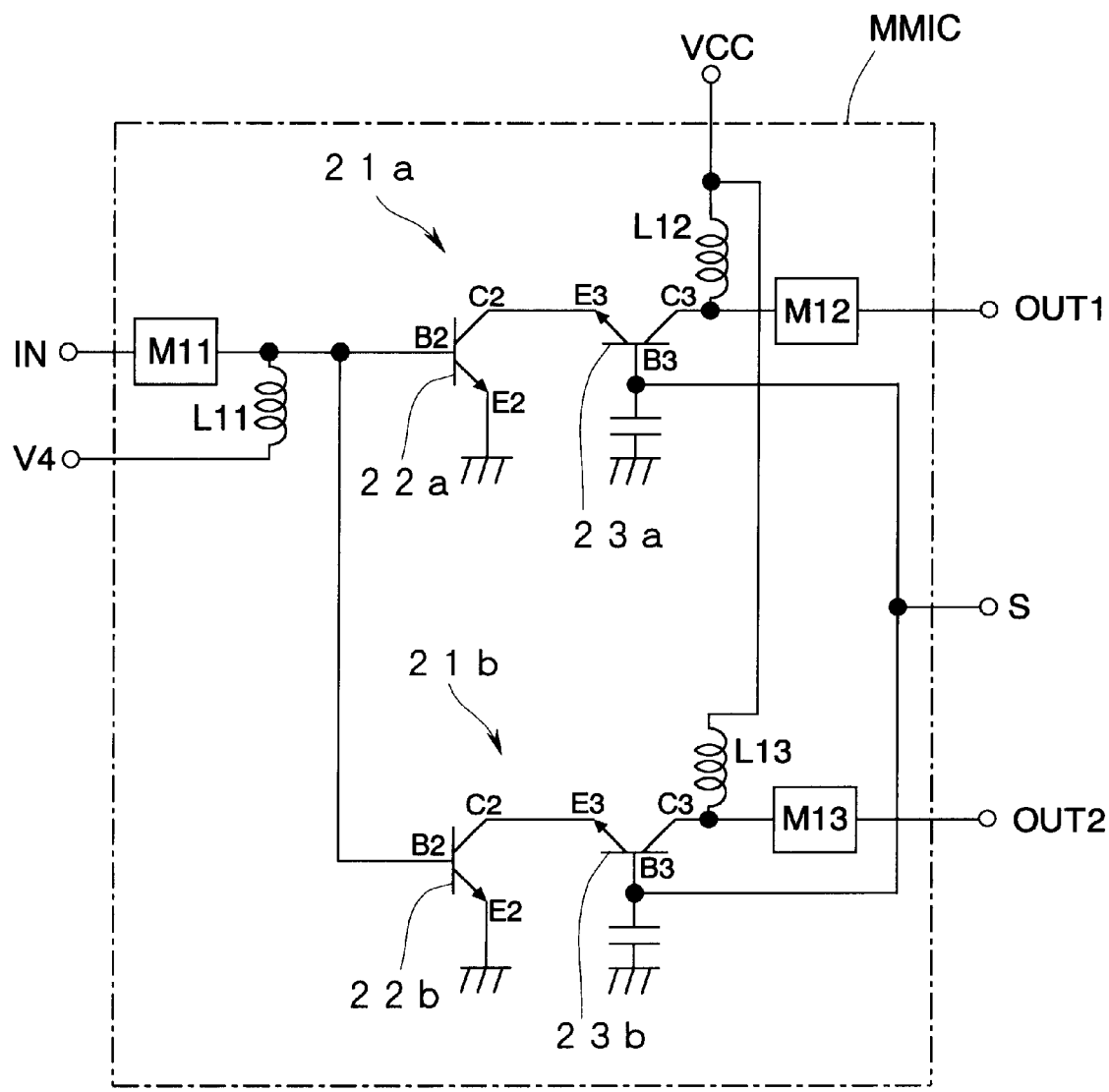
FIG. 9 is a circuit diagram showing the second embodiment of the adjustable high-frequency switch according to the present invention.

FIG. 9 shows the second embodiment of the adjustable high-frequency switches according to the present invention.

In this embodiment, high-frequency switches 21a and 21b according to the first embodiment are placed in parallel on an MMIC. The bases B2 of the HBTs 22a and 22b for each of high-frequency switches 21a and 21b are connected with each other. These bases B2 receive a common input signal IN through an input matching circuit M11. These bases B2 are supplied with a base bias V4 applied an inductor L11 which features sufficiently high impedance at the frequency to be used.

The bases B3 of the HBTs 23a and 23b for each of high-frequency switches 21a and 21b receive a common control signal S. The collectors C3 of the HBTs 23a and 23b are supplied with a supply voltage VCC through the inductors L12 and L13 which feature sufficiently high impedance at the frequency to be used.

The collector C3 of the HBT 23a outputs an output signal OUT1 through an output matching circuit M12. The collector C3 of the HBT 23b outputs an output signal OUT2 through an output matching circuit M13.

The adjustable high-frequency switches according to this embodiment activates/inactivates the high-frequency switches 21a, 21b by the control signal S. When the control signal S is at a high level, the input signal IN fed to each of bases B2 of the HBTs 22a and 22b are amplified in accordance with the amplification factors of the high-frequency switches 21a and 21b, and the amplified signals are outputted as the output signals OUT1 and OUT2. That is, these adjustable high-frequency switches can be operated as a power divider. On the other hand, when the control signal S is at a low level, the high-frequency switches 21a and 21b are inactivated. That is, these adjustable high-frequency switches can be operated as an attenuator having high isolation characteristics.

Figure 10:
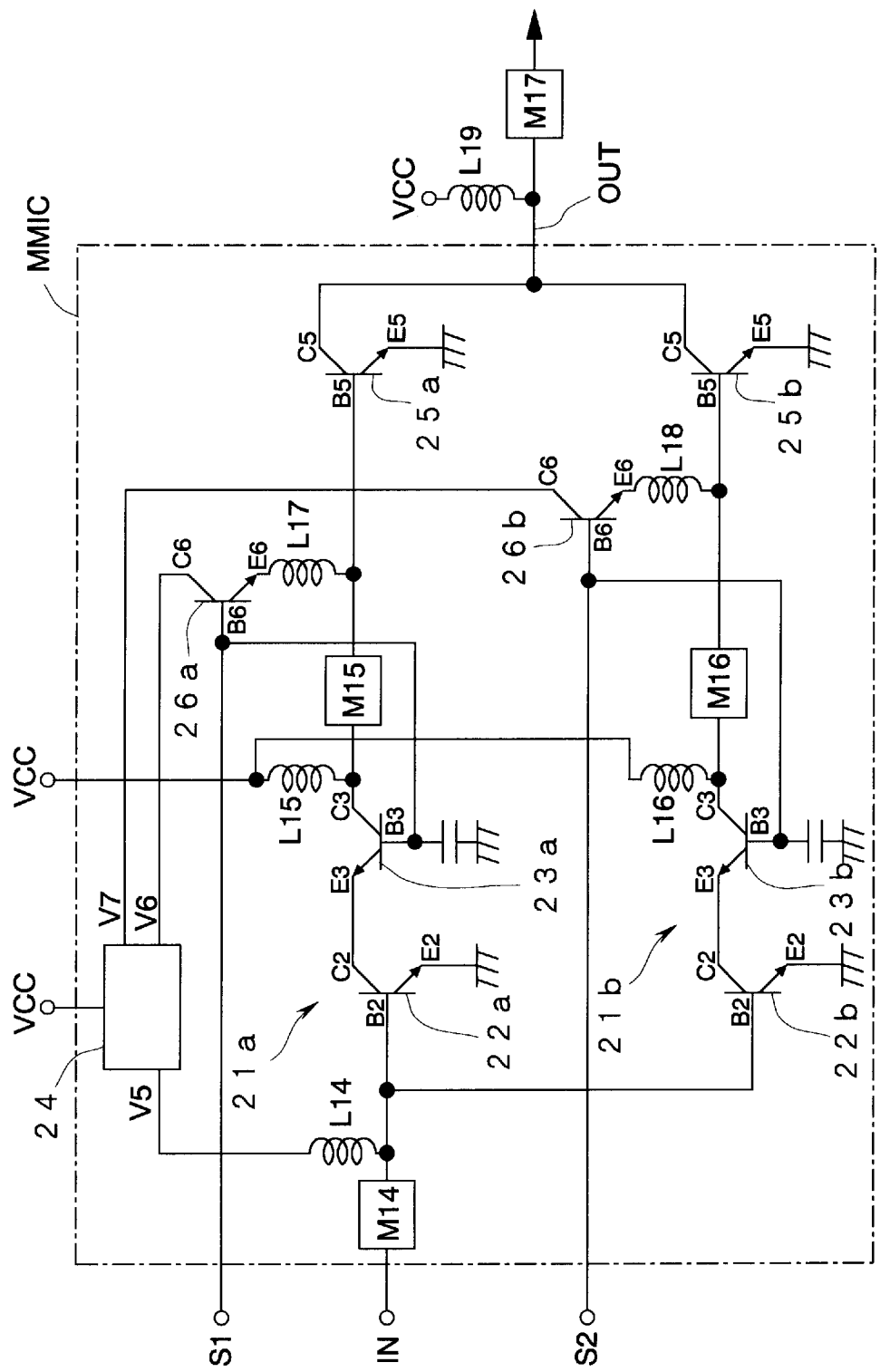
FIG. 10 is a circuit diagram showing the first embodiment of the adjustable high-frequency amplifier according to the present invention.

FIG. 10 shows the first embodiment of the adjustable high-frequency power amplifier according to the present invention. The adjustable high-frequency power amplifier according to this embodiment is used in, for example, the transmission circuit of a portable terminal of PDC system or W-CDMA system.

In the adjustable high-frequency power amplifier according to this embodiment is such that high-frequency switches 21a and 21b are placed in parallel on an MMIC, as in the second embodiment of the adjustable high-frequency switches described above. The bases B2 of the HBTs 22a and 22b for each of high-frequency switches 21a and 21b are connected with each other. These bases B2 receive a common input signal IN through an input matching circuit M14 from the outside of the MMIC. These bases B2 are supplied with a base bias V5 through an inductor L14 which features sufficiently high impedance at the frequency to be used.

The base bias V5 is supplied from a power-supply circuit 24 formed on the MMIC. The power-supply circuit 24 generates the base biases V5, V6, and V7 from a supply voltage VCC which is supplied from the outside.

The bases B3 of the HBTs 23a and 23b receive control signals S1 and S2 from the outside of the MMIC, respectively. The collectors C3 of the HBTs 23a and 23b are supplied with the supply voltage VCC through inductors L15 and L16 which feature sufficiently high impedance at the frequency to be used, respectively.

The collector C3 of the HBT 23a is connected to the base B5 of HBT 25a which has an emitter grounded through an output matching circuit M15. The collector C3 of the HBT 23b is connected to the base B5 of the HBT 25b which has an emitter grounded through an output matching circuit M16. The HBTs 25a and 25b correspond to the third bipolar transistors 14 shown in FIG. 5. These HBTs 25a and 25b have functions as power amplifiers for a high power output and for a low power output, respectively. The sizes of the HBTs 25a and 25b are 64 fingers and 8 fingers, respectively.

The base B5 of the HBT 25a is connected to the emitter E6 of the HBT 26a through an inductor L17 which features sufficiently high impedance at the frequency to be used. The base B6 of the HBT 26a receives the control signal S1. The collector C6 of the HBT 26a is supplied with the base bias V6.

Likewise, the base B5 of the HBT 25b is connected to the emitter E6 of the HBT 26b through an inductor L18 which features sufficiently high impedance at the frequency to be used. The base B6 of the HBT 26b receives the control signal S2. The collector C6 of the HBT 26b is supplied with the base bias V7.

The collectors C5 of the HBTs 25a and 25b are connected with each other, and outputted as an output signal OUT to the outside of the MMIC. The output signal OUT is supplied with the supply voltage VCC through an inductor L19 which features sufficiently high impedance at the frequency to be used. The output signal OUT is outputted to an external circuit (not shown) through an output matching circuit M17. The inductor L19 and the output matching circuit M17 are mounted on a printed-circuit board together with the MMIC.

The portable terminal including the adjustable high-frequency power amplifier described above, sets either of the control signals S1 or S2 at a high level based on the information outputted from the base station. Concretely, the portable terminal sets the control signal S1 at a high level for the activation of the high-frequency switch 21a when the maximum output power is required, and except for that time it sets the control signal S2 at a high level for the activation of the high-frequency switch 21b.

First, when the control signal S1 is at a high level, the HBT 26a is turned "on" and feeds the base bias V6 to the base B5 of the HBT 25a. Then, the input signal IN is transmitted to the base B5 of the HBT 25a owing to the activation of the high-frequency switch 21a. The HBT 25a amplifies the input signal IN transmitted to its base B5, and the amplified signal is outputted as the output signal OUT.

On this occasion, the high-frequency switch 21b is held in an inactive state since the control signal S2 is kept at a low level. The HBT 26b is held "off" since the control signal S2 is kept at a low level. Therefore, the base bias V7 is not supplied to the HBT 25b, and any unnecessary current is prevented from flowing between the base B5 and emitter E5 of the HBT 25b.

Furthermore, since "S22 characteristics" features a high impedance while the bipolar transistor is "off", there is little problem of matching due to the interconnection of the collectors C5 of the HBTs 25a and 25b. Besides, the base B5 of the HBT 25b has a pull-down resistor or the like (not shown) connected thereto so that the HBT25b can be surely turned off by the control signal S2 kept at a low level.

On the other hand, when the control signal S2 is at a high level, the HBT 26b is turned "on" and feeds the base bias V7 to the base B5 of the HBT 25b. In addition, the input signal IN is transmitted to the base B5 of the HBT 25b owing to the activation of the high-frequency switch 21b. The HBT 25b amplifies the input signal IN transmitted to its base B5, and the amplified signal is outputted as the output signal OUT.

On this occasion, the high-frequency switch 21a is held in an inactive state since the control signal S1 is kept at a low level. The HBT 26a is held "off" since the control signal S1 is kept at a low level. Therefore, the base bias V6 is not supplied to the HBT 25a, and any unnecessary current is prevented from flowing between the base B5 and emitter E5 of the HBT 25a. Furthermore, the base B5 of the HBT 25a has a pull-down resistor or the like (not shown) connected thereto so that the HBT 25a can be surely turned off by the control signal S1 kept at a low level.

Figure 11:
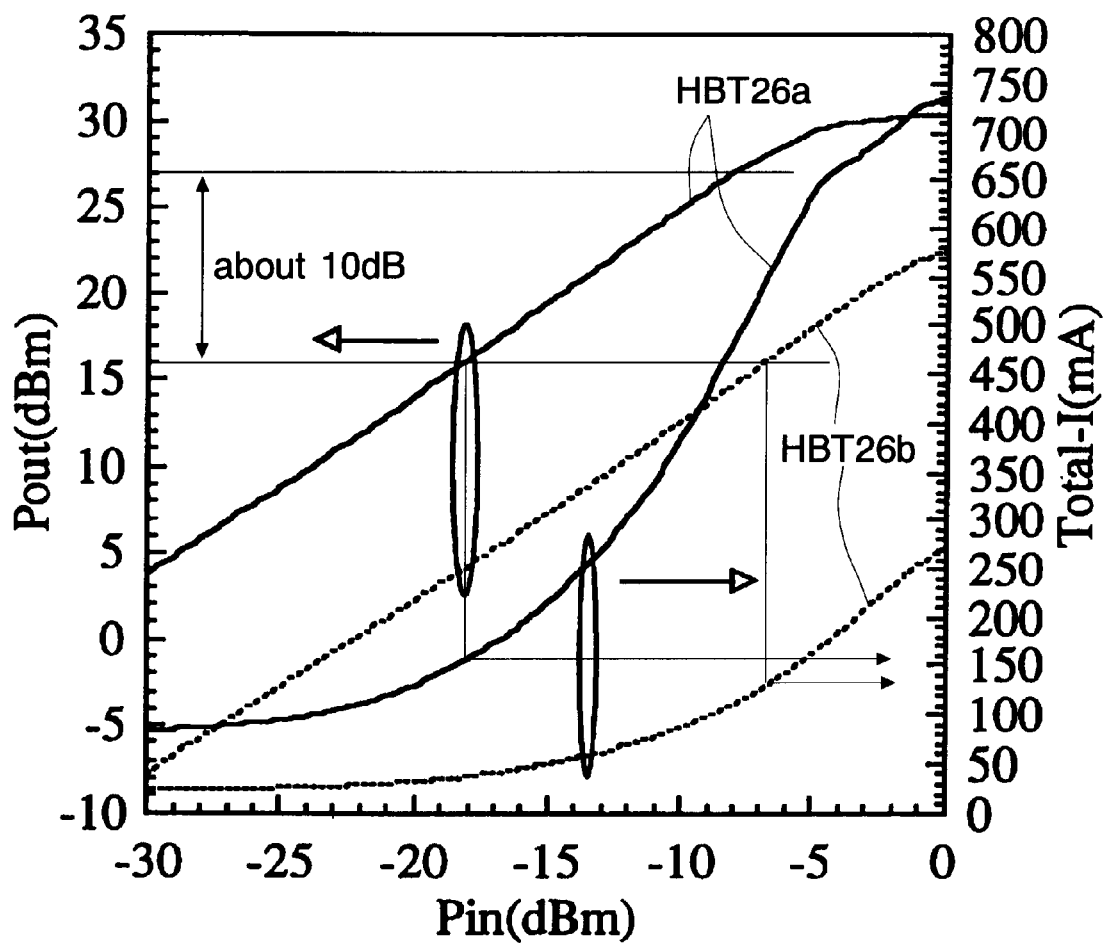
FIG. 11 is a chart showing the input/output characteristics of the adjustable high-frequency amplifier shown in FIG. 10.

FIG. 11 shows the input/output characteristics of the adjustable high-frequency power amplifier shown in FIG. 10. In the chart of FIG. 11, the input power Pin of the input signal IN is indicated on the horizontal axis, the output power Pout of the output signal OUT on the left vertical axis, and the current consumption Total-I of the adjustable high-frequency power amplifier on the right vertical axis. In this chart, solid lines indicate the characteristics of the HBT 26a, and dotted lines indicate the characteristics of the HBT 26b.

In this embodiment, the maximum output power of the HBT 26a is set at 27 dBm. Besides, the portable terminal performs the change-over between the high-frequency switches 21a and 21b by controlling the control signals S1 and S2 when the output power Pout is about 10 dB lower than the maximum output power (that is, when the output power Pout is 16 dBm). Therefore, when the output power Pout is greater than 16 dBm, the HBT 26a for the high output operates. When the output power Pout is less than 16 dBm, the HBT 26b for the low output operates.

Furthermore, the output power Pout having lowered 10 dB from the maximum output power is a power level which is most frequently used even in the W-CDMA system. The current consumption Total-I corresponding to the output power Pout of 16 dBm is about 163 mA during the operation of the HBT 26a, and is about 140 mA during the operation of the HBT 26b.

Figure 12:
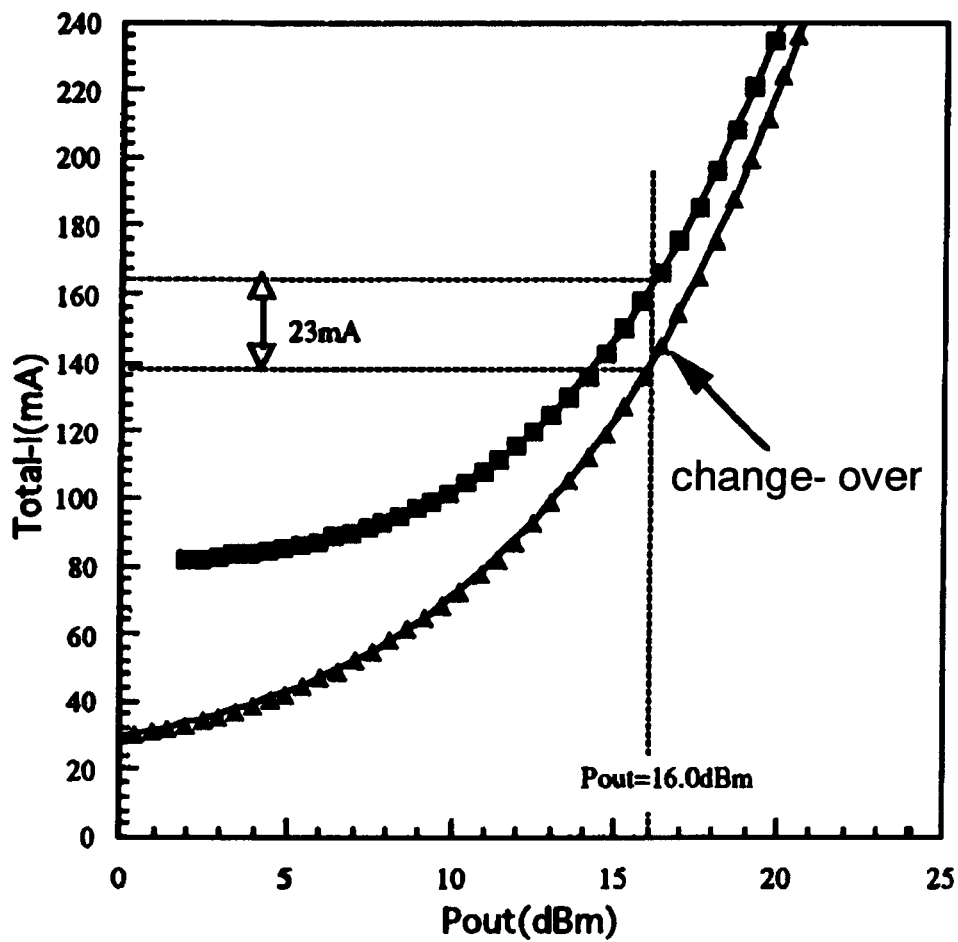
FIG. 12 is a chart showing the consumption current of the adjustable high-frequency amplifier shown in FIG. 10.

FIG. 12 shows the current consumption Total-I (on the vertical axis) versus the output power Pout (on the horizontal axis).

An upper curve indicates the current consumption Total-I when the HBT 26a is operated. A lower curve indicates the current consumption Total-I when the HBT 26b is operated. The difference between the current consumption Total-I during the operation of the HBT 26a and during the operation of the HBT 26b is, for example, about 23 mA when the output power Pout is 16 dBm. On this occasion, the high-frequency switch 21b is operating and the current consumption can be reduced about 23 mA as compared with the current consumption in the case of operating the high-frequency switch 21a.

Besides, the difference between the current consumption Total-I during the operation of the HBT 26a and that during the operation of the HBT 26b becomes larger as the output power Pout is lower. With this adjustable high-frequency power amplifier, accordingly, the effect of reducing the power consumption is greater especially as the output power Pout is lower.

The adjustable high-frequency power amplifier according to this embodiment sets either of the control signals S1 or S2 at a high level with the predetermined output power Pout as the boundary, thereby to on-control either of the high-frequency switches 21a or 21b. Since the HBT 26a or HBT 26b of the optimum finger number corresponding to the output power Pout is turned "on", the current consumption of the portable terminal is substantially reduced in comparison with that in the prior art.

Since the current consumption is reduced, the battery of the portable terminal can be made small in size. Besides, since the quantity of heat generation is decreased by having the current consumption reduced, radiation parts can be reduced and a radiating mechanism can be simplified. As a result, the whole portable terminal can be made small in size, and the cost of the portable terminal can be cut down. Further, in the case where the battery of the portable terminal is kept at the same capacity as in the prior art, the talking time can be substantially lengthened.

Each of high-frequency switches 21a and 21b have effects similar to those of the first embodiment of the high-frequency switch described above.

Figure 13:
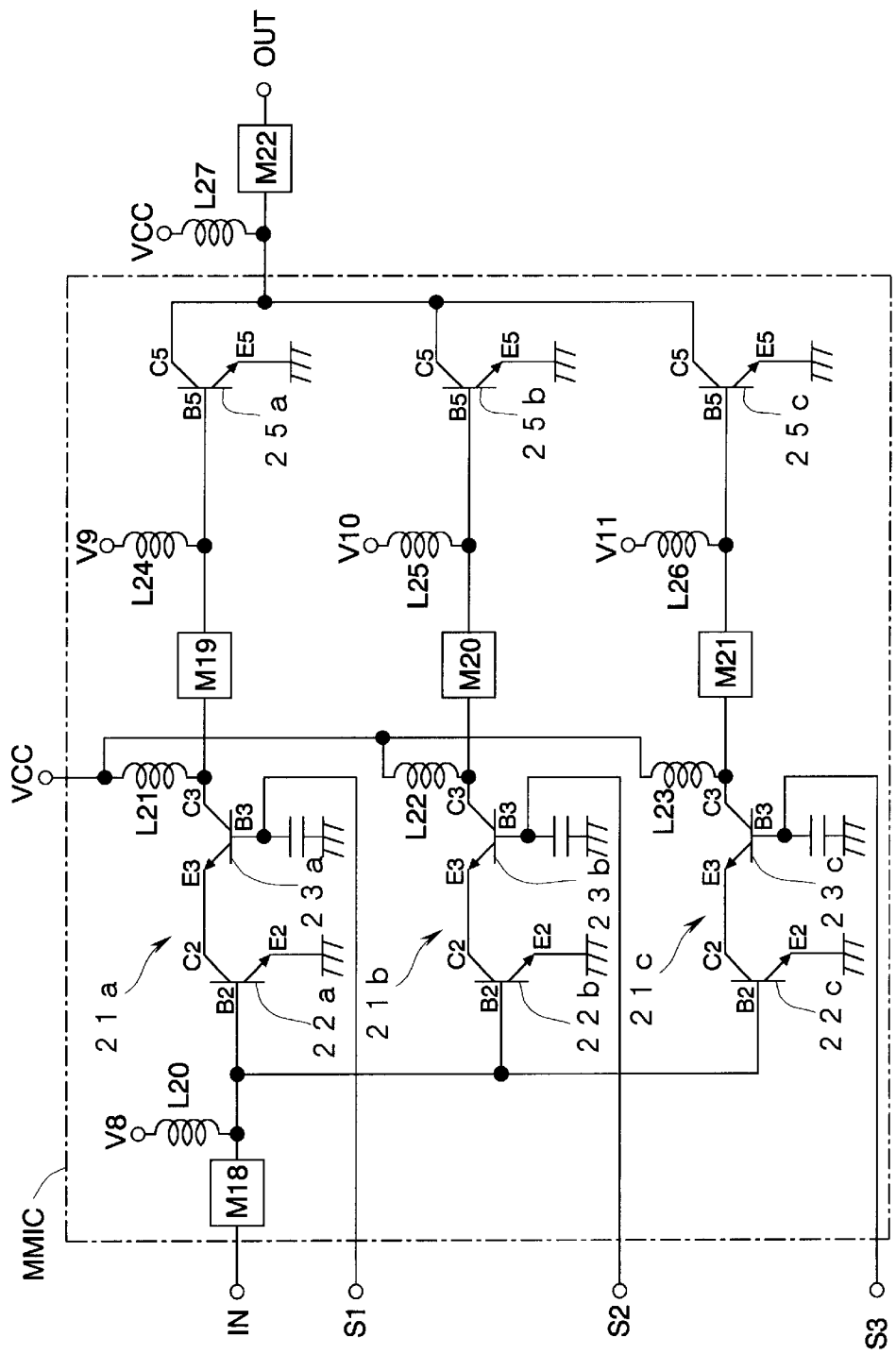
FIG. 13 is a circuit diagram showing the second embodiment of the adjustable high-frequency amplifier according to the present invention.

FIG. 13 shows the second embodiment of the adjustable high-frequency power amplifier according to the present invention. This adjustable high-frequency power amplifier is used in, for example, the transmission circuit of a portable terminal of W-CDMA system.

The adjustable high-frequency power amplifier is formed on an MMIC, and it includes high-frequency switches 21a, 21b, and 21c placed in parallel. The bases B2 of the HBTs 22a, 22b, and 22c for each of high-frequency switches 21a, 21b, and 21c are connected with one another. These bases B2 receive a common input signal IN through an input matching circuit M18 from the outside of the MMIC. These bases B2 are supplied with a base bias V8 through an inductor L20 which features sufficiently high impedance at the frequency to be used.

The base bias V8 is supplied from a power-supply circuit (not shown) formed on the MMIC, as in the first embodiment of the adjustable high-frequency power amplifier described above. The power-supply circuit also generates base biases V9, V10, and V11 from a supply voltage VCC which is supplied from the outside.

The bases B3 of the HBTs 23a, 23b, and 23c for each of high-frequency switches 21a, 21b, and 21c receive corresponding control signals S1, S2, and S3 from the outside of the MMIC. The collectors C3 of the HBTs 23a, 23b, and 23c are supplied with the supply voltage VCC through respectively corresponding inductors L21, L22, and L23, which feature sufficiently high impedance at the frequency to be used.

The collector C3 of the HBT 23a is connected to the base B5 of the HBT 25a whose emitter is grounded through an output matching circuit M19. The collector C3 of the HBT 23b is connected to the base B5 of the HBT 25b whose emitter is grounded through an output matching circuit M20. The collector C3 of the HBT 23c is connected to the base B5 of the HBT 25c whose emitter is grounded through an output matching circuit M21. The HBTs 25a, 25b and 25c correspond to the third bipolar transistors 14 shown in FIG. 5. The sizes of the HBTs 25a, 25b and 25c are 20 fingers, 20 fingers, and 10 fingers, respectively.

The base B5 of the HBT 25a is supplied with the base bias V9 through an inductor L24 which features sufficiently high impedance at the frequency to be used. The base B5 of the HBT 25b is supplied with the base bias V10 through an inductor L25 which features sufficiently high impedance at the frequency to be used. The base B5 of the HBT 25c is supplied with the base bias V11 through an inductor L26 which features sufficiently high impedance at the frequency to be used.

The collectors C5 of the HBTs 25a, 25b and 25c are connected with one another, and they output an output signal OUT to the outside of the MMIC. The output signal OUT is supplied with the supply voltage VCC through an inductor L27 which features sufficiently high impedance at the frequency to be used. The output signal OUT is outputted to an external circuit (not shown) through an output matching circuit M22. The inductor L27 and the output matching circuit M22 are mounted on a printed-circuit board together with the MMIC.

As listed in Table 1 in the following, the adjustable high-frequency power amplifier according to this embodiment turns "on" or "off" the HBTs 25a, 25b, and 25c by the combinations of the control signals S1, S2, and S3. The maximum output power which is outputted from the output signal OUT makes five changes in modes, depending upon the "on" and "off" states of the HBTs. Here, the maximum output power is proportional to the sum of the finger numbers of the HBTs 25a, 25b, and 25c turned "on".

TABLE 1

| CONTROL SIGNALS | | | |
|---|---|---|---|
| S1 HBT25a | S2 HBT25b | S3 HBT25c | TOTAL FINGER NUMBER (MAXIMUM OUTPUT POWER) |
| ON | ON | ON | 50 |
| ON | ON | OFF | 40 |
| OFF | ON | ON | 30 |
| ON | OFF | OFF | 20 |
| OFF | OFF | ON | 10 |

By way of example, in a case where the portable terminal transmits data from a place distant from a base station, the maximum output power is required. At this time, the portable terminal sets all the control signals S1, S2, and S3 at a high level, thereby to turn "on" all the HBTs 25a, 25b, and 25c, and to set the total finger number (maximum output power) at 50.

Besides, in a case where the portable terminal transmits voice from a place near to the base station, it can be transmitted with low output power. At this time, the portable terminal sets only the control signal S3 at a high level, thereby to turn "on" only the HBT 25c, and to set the total finger number (maximum output power) at 10.

Further, in the portable terminal of W-CDMA system, the output power of data needs to be made 3 dB higher than that of voice. That is, the output power needed for transmitting the data becomes double higher than in the case of the voice. Therefore, for example, in transmitting data in an mean transmission state, the portable terminal sets the control signals S1 and S2 at a high level and the control signal S3 at a low level, thereby to turn "on" the HBTs 25a and 25b, and to set the total finger number at 40. In transmitting voice, the portable terminal sets only the control signal S1 at a high level, thereby to turn "on" only the HBT 25a and to set the total finger number at 20.

The adjustable high-frequency power amplif ier according to this embodiment has effects similar to those of the first embodiment of the adjustable high-frequency power amplifier described above.

Moreover, since the adjustable high-frequency power amplifier according to this embodiment changes the maximum output power in the five modes by the control signals S1, S2, and S3, it can control the output power of the portable terminal more finely and can lower the power consumption substantially.

Especially, the effect of lowering the power consumption is great in case of applying the power amplifier to the portable terminal of W-CDMA system in which the control range of output power is more than 70 dB.

Here, in the second embodiment of the adjustable high-frequency power amplifier described above, it relates to the example in which this adjustable high-frequency power amplifier is applied to the transmission circuit of the portable terminal of W-CDMA system. The present invention, however, is not restricted to such an embodiment. The power amplifier may well be applied to, for example, the transmission circuit of a portable terminal of PDC system.

Furthermore, in the first embodiment of the adjustable high-frequency power amplifier described above, it relates to the example in which the change-over between the high-frequency switches 21a and 21b is performed when the output power has become 10 dB lower than the maximum output power. The present invention, however, is not restricted to such an embodiment. The change-over may well be performed, for example, when the output power has become half of the maximum output power.

As described above about the present invention in detail, the embodiments and its modifications described above are mere examples of the invention, and the present invention is not restricted to them. It is apparent that the embodiments and its modifications can be adapted to the limitations of the present invention.

What is claimed is:

1. An adjustable high-frequency switch comprising a plurality of high-frequency switches, each including a first bipolar transistor whose base receives an input signal having high frequency and a second bipolar transistor which is connected with said first bipolar transistor into a cascode configuration and which outputs, from its collector, an amplified input signal in response to a control signal which on/off-controls the second bipolar transistor; wherein said bases of the first bipolar transistors of the plurality of high-frequency switches are respectively interconnected; and said amplified input signals from said plurality of high-frequency switches are selectively outputted in response to said control signal.

2. The adjustable high-frequency switch according to claim 1, wherein said bases of the second bipolar transistors commonly receive said control signal.

3. An adjustable high-frequency power amplifier comprising:

(i) an adjustable high-frequency switch, including a plurality of high-frequency switches, wherein each includes a first bipolar transistor whose base receives an input signal having high frequency and a second bipolar transistor which is connected with said first bipolar transistor into a cascode configuration and which outputs, from its collector, an amplified input signal in response to a control signal which on/off-controls the second bipolar transistor; wherein said bases of the first bipolar transistors of the lurality of high-frequency switches are respectively nterconnected; and said amplified input signals from said plurality of high-frequency switches are selectively outputted in response to said control signal and (ii) a plurality of third bipolar transistors whose emitters are grounded and whose bases are respectively connected to collectors of corresponding said second bipolar transistors in the adjustable high-frequency switch wherein collectors of said third bipolar transistors are respectively interconnected.

4. The adjustable high-frequency power amplifier according to claim 3, wherein said bases of the respective third bipolar transistors are supplied with operating-biases in response to said control signal.

* * * * *